(12) United States Patent  
Takasu

(10) Patent No.: US 7,531,877 B2  
(45) Date of Patent: May 12, 2009

(54) SEMICONDUCTOR DEVICE

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 404 days.

(21) Appl. No.: 11/199,292

(22) Filed: Aug. 8, 2005

(65) Prior Publication Data

US 2006/0033164 A1 Feb. 16, 2006

(30) Foreign Application Priority Data

Aug. 12, 2004 (JP) ............................. 2004-235005

(51) Int. Cl.  
*H01L 29/72* (2006.01)

(52) U.S. Cl. ..................... 257/347; 257/379; 257/380; 257/529; 257/536

(58) Field of Classification Search ................. 257/347, 257/379, 380, 529, 536  
See application file for complete search history.

(56) References Cited

U.S. PATENT DOCUMENTS 6,249,029 B1 * 6/2001 Bryant et al. ............... 257/351  
2002/0145176 A1 * 10/2002 Takasu et al. ............... 257/529

* cited by examiner

*Primary Examiner*—Edward Wojciechowicz  
(74) *Attorney, Agent, or Firm*—Adams & Wilks

(57) ABSTRACT

A semiconductor device has a silicon-on-insulator (SOI) substrate comprised of a silicon substrate, a buried insulating film disposed on the silicon substrate, and a single-crystal silicon device forming layer disposed on the buried insulating film. A bleeder resistor circuit comprises resistors each formed of the single-crystal silicon device forming layer. A MOS transistor has a thin gate oxide film disposed on the single-crystal silicon device forming layer and a gate electrode disposed on the thin gate oxide film. Electrodes are disposed over the respective resistors for fixing a resistance of the resistors, the electrodes being made of the same material as that of the gate electrode of the MOS transistor. Impurity diffusion regions are disposed under the respective resistors and in the silicon substrate for fixing the resistance of the resistors.

6 Claims, 1 Drawing Sheet

US 7,531,877 B2

SEMICONDUCTOR DEVICE

BACKGROUND OF THE INVENTION

1. Field of the Invention

The present invention relates to a semiconductor device including a bleeder resistor circuit formed on an SOI (Silicon-On-Insulator) substrate.

2. Description of the Related Art

A semiconductor integrated circuit formed on an SOI substrate is now widely known. In particular, a high-speed MOS transistor which operates in full depletion mode shows more excellent characteristics than those of the conventional MOS transistor formed on a silicon substrate.

A bleeder resistor composed of a plurality of polycrystalline silicon resistors is often used in an analog IC such as a voltage detector. It is however difficult to manufacture an analog IC with high precision since it is difficult to obtain the same resistance in the polycrystalline silicon resistors due to the influence of grains (grain boundaries). An arrangement in which a potential of a conductor arranged over an upper surface or below a lower surface of a polycrystalline silicon resistor is fixed to obtain a desired resistance is known (for example, refer to JP 09-321229 A (FIG. 1)).

The bleeder resistor composed of the plurality of polycrystalline silicon resistors is often used in the conventional analog IC such as the voltage detector, which is formed on the SOI substrate. However, as disclosed in, for example, JP 09-321229 A, even if the potential of each of the polycrystalline silicon resistors is fixed by disposing electrodes on insulating films surround the resistor in vertical directions, the influence of grain boundary is larger and it is difficult to form resistors having the same resistance with high precision. Further, increase in an occupation area of the bleeder resistor region by providing especially contact holes to fix potential is a problem, which leads to an increase in cost of the IC.

SUMMARY OF THE INVENTION

In order to solve the above-mentioned problems, the present invention employs the following measures.

According to a first aspect of the present invention, there is provided a semiconductor device having such a structure that a bleeder resistor is formed of a single-crystal-silicon device-forming layer formed on an SOI substrate.

According to a second aspect of the present invention, in the first aspect of the invention, an upper electrode for resistance fixation, which is made of the same material as that of a gate electrode of the MOS transistor, is formed over the resistor in the bleeder resistor and on a thin insulating film made of the same material as that of a thin gate oxide film of the MOS transistor, the upper electrode for resistance fixation being fixed to an identical potential as that of the resistor located below the electrode; and a lower diffusion region for resistance fixation comprised of an impurity diffusion region, is formed on a surface portion of the SOI substrate, which is made of silicon, and under a buried insulating film of the SOI substrate, the surface portion corresponding to a portion below the bleeder resistor, and is fixed to an identical potential as that of the resistor in the bleeder resistor.

According to a third aspect of the present invention, in the second aspect of the invention, the three parts; the upper electrode for resistance fixation, each of the resistors in the bleeder resistor, and the lower diffusion region for resistance fixation corresponding to the surface portion of the silicon substrate, are collectively and electrically connected to one another through a conductor filling a contact hole for potential fixation.

According to the present invention the semiconductor integrated circuit formed on the SOI substrate includes the bleeder resistor composed of the plurality of resistors and is formed of the single-crystal-silicon device-forming layer formed on the SOI substrate. The electrode for resistance fixation is formed above the resistor and on the thin oxide film, and is fixed to the identical potential as that of the resistor located below the electrode. And, the impurity diffusion region is formed on the portion of the substrate corresponding to the lower portion of the resistor and under the buried insulating film of the SOI substrate, and is fixed to the identical potential of the bleeder resistor located above the diffusion region, which further enables more precise voltage division.

Moreover, those three elements, the upper electrode for resistance fixation, the bleeder resistor, and the lower impurity diffusion region for resistance fixation formed on the surface portion of the silicon substrate, are collectively and electrically connected with one another through the conductor filling the contact hole for potential fixation. The area of the bleeder resistor region can thus be reduced without requiring a large area for potential fixation. hence it is possible to form the bleeder resistor circuit at a lower cost and with higher precision compared to the conventional ones. Accordingly, an inexpensive analog IC with high precision can be provided.

BRIEF DESCRIPTION OF THE DRAWINGS

In the accompanying drawing.

DETAILED DESCRIPTION OF THE PREFERRED EMBODIMENTS

Figure 1:
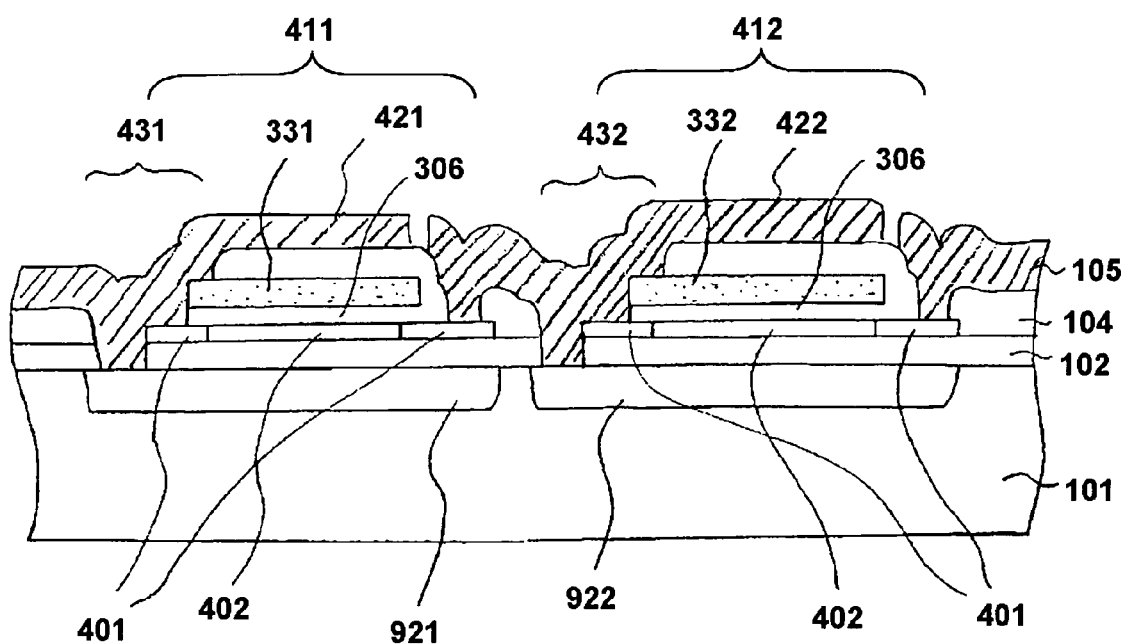
FIG. 1 is a sectional view showing an embodiment of a bleeder resistor of a semiconductor device according to the present invention.

In a semiconductor integrated circuit formed on an SOI substrate: a bleeder resistor circuit is formed of a single-crystal-silicon device-forming layer, an electrode for resistance fixation is formed of the same material as that of a gate electrode and on a thin gate oxide film at a portion corresponding to a portion above the bleeder resistor, and is fixed to an identical potential as that of the bleeder resistor located below the electrode; and an impurity diffusion region is formed on a portion of the silicon substrate corresponding to a portion below the bleeder resistor and under a buried insulating film of the SOI substrate, and is fixed to an identical potential as that of the bleeder resistor located above the impurity diffusion region. Further, a semiconductor device is provided in which three layers, the electrode for resistance fixation, which is formed of the same material as that of the gate electrode, the bleeder resistor, and the impurity diffusion region formed on the portion of the silicon substrate, are electrically connected with one another through a conductor filling a contact hole for potential fixation. Therefore, an inexpensive analog IC with high precision can be provided.

Embodiment

Hereinafter, description will be made of an embodiment of the present invention with reference to the drawing. FIG. 1 is a view showing an embodiment of a bleeder resistor circuit (hereinafter "bleeder resistor") of a semiconductor device according to the present invention.

A low concentration impurity region 402 is formed while being sandwiched by a pair of high concentration impurity regions 401 in a single-crystal silicon device forming layer (hereinafter "single-crystal-silicon device-forming layer") formed on a silicon substrate 101 through a buried oxide film 102, thereby forming a resistor. That is, the single-crystal-silicon device-forming layer has the high concentration impurity regions 401 and the low concentration impurity region 402 in FIG. 1. Although only two resistors are shown for simplicity in FIG. 1, the bleeder resistor is actually constituted by plural resistors (411, 412).

The high concentration impurity regions 401 are connected with an aluminum film 105 respectively through first and second contact holes 431 and 432 for potential fixation opened through an intermediate insulating film 104 formed of a BPSG film or the like. The aluminum film 105 connected with one of the high concentration impurity regions 401 is formed so as to cover the low concentration impurity region 402 that determines a resistance of the resistor, thereby stabilizing the resistance.

Formed on the respective portions above the first resistor 411 and the second resistor 412 are upper electrodes in the form of a first electrode 331 for resistance fixation and a second electrode 332 for resistance fixation both on a thin oxide film 306 made of the same material as that of a gate oxide film of a MOS transistor formed in the same semiconductor integrated circuit. The thin oxide film 306 is formed through the same step as that of forming the gate oxide film of the MOS transistor in the same semiconductor integrated circuit, though this is not shown in the drawing. Also, the first electrode 331 for resistance fixation and the second electrode 332 for resistance fixation are preferably formed for simplicity with the same material and by the same steps as those of a gate electrode of the MOS transistor in the same semiconductor integrated circuit, though this is not shown in the drawing.

A first lower diffusion region 921 for resistance fixation and a second lower diffusion region 922 for resistance fixation are respectively formed below the first resistor 411 and the second resistor 412 and also on a surface of the silicon substrate 101 and under the buried oxide film 102.

For example, in the case where the silicon substrate 101 has P-type conductivity, it is preferable to form the first lower diffusion region 921 for resistance fixation and the second lower diffusion region 922 for resistance fixation by introducing an N-type impurity into its surface to electrically isolate these regions.

When the silicon substrate 101 having N-type conductivity, P-type lower diffusion regions for resistance fixation are formed.

Two lower diffusion regions for resistance fixation are shown in the above, however the number of diffusion regions may be set in accordance with the number of resistors in the bleeder resistor region, and is not limited to two.

Moreover, when the precision for divided voltage by the bleeder resistor has a margin due to the specification required for the product, a single lower diffusion region for potential fixation may be formed for the entire bleeder resistor region, where the lower diffusion region is not connected with each resistor through the same contact hole, but is separately and preferably fixed to an appropriate potential, or may be omitted.

One end of the first resistor 411, the first upper electrode 331 for resistance fixation, and the first lower diffusion region 921 for resistance fixation are electrically and collectively connected with one another through a conductor 421 made of aluminum or the like which fills the first contact hole 431 for potential fixation, thereby having the identical potential.

Further, one end of the second resistor 412, the second upper electrode 332 for resistance fixation, and the second lower diffusion region 922 for resistance fixation are electrically and collectively connected with one another through a conductor 422 made of aluminum or the like which fills the second contact hole 432 for potential fixation, thereby having the identical potential.

As described above, all the plurality of resistors forming the bleeder resistor are manufactured in the same manner. As a result, the potential difference is almost zero among the electrodes for resistance fixation which locates over the resistor, the resistor itself, and the lower diffusion region for resistance fixation. Accordingly, the resistors processed into the same dimensional shape exhibit the same resistance.

In comparison with a conventional bleeder resistor formed of a polycrystalline silicon thin film, the single-crystal-silicon device-forming layer itself forms the resistor in the present invention. Thus, the influence of grains of the polycrystalline silicon thin film can be eliminated. Therefore, a more uniform resistor can be obtained.

Since the resistance of the resistor formed of single-crystal-silicon thin film is lowered by addition of a less amount of impurities compared with the resistor formed of the polycrystalline silicon thin film, there is also a problem that the resistor formed of the single-crystal-silicon thin film is susceptible to the influence of potentials of electrodes (or their equivalents) located above and below the resistor.

According to the present invention, the electrode for resistance fixation is formed above the resistor through the thin oxide film, and is fixed to the identical potential as that of the resistor located below the electrode. Further, the impurity diffusion region is formed on the substrate portion corresponding to the lower portion of the resistor through the buried insulating film of the SOI substrate, and is fixed to the identical potential of the bleeder resistor located above the diffusion region. Therefore, it is possible to realize voltage division with higher precision.

Moreover, the three parts: the upper electrode for resistance fixation, the bleeder restor, and the lower impurity diffusion region for resistance fixation, are collectively and electrically connected with one another through the conductor filling the contact hole for potential fixation. Thus, the area of the bleeder resistor region can be reduced without requiring a large are for potential fixation. Therefore, it is possible to form the bleeder resistor circuit at lower cost and with higher precision as compared with a convention one.

In FIG. 1 explanation has been made of the case where the resistor having a high resistance is formed in which the low concentration impurity region 402 is formed while being sandwiched by the pair of high concentration impurity regions 401. However, the entire resistor can be composed of the high concentration impurity region 401 in the use where high resistance is not required.

What is claimed is:

1. A semiconductor device comprising:
   a silicon-on-insulator (SOI) substrate having a single-crystal silicon device forming layer disposed on a silicon substrate through a buried insulating film;
   a bleeder resistor region comprised of a plurality of resistors each of which is made of the single-crystal silicon device forming layer;
   a MOS transistor disposed on the single-crystal silicon device forming layer, the MOS transistor having a thin gate oxide film and a gate electrode disposed on the thin gate oxide film;
   a plurality of electrodes made of the same material as that of the gate electrode of the MOS transistor and being disposed over the respective resistors via a thin insulating film made of the same material as that of the thin gate oxide film of the MOS transistor, each electrode being fixed to an identical potential as that of the corresponding resistor over which the electrode is disposed;

a plurality of diffusion regions disposed in surface portions of the silicon substrate located under the respective resistors and under the buried insulating film, each diffusion region being fixed to the identical potential as that of the corresponding resistor under which the diffusion region is disposed; and a plurality of contact holes formed at least through the buried oxide film, each of the contact holes being filled with a conductor that electrically connects a corresponding one of the resistors to the corresponding electrode and diffusion region.

2. A semiconductor device according to claim 1; wherein the single-crystal silicon device forming layer comprises a pair of high concentration impurity regions and a low concentration impurity region disposed between the pair of high concentration impurity regions.

3. A semiconductor device comprising:

a silicon-on-insulator (SOI) substrate comprised of a silicon substrate, a buried insulating film disposed on the silicon substrate, and a single-crystal silicon device forming layer disposed on the buried insulating film;

a bleeder resistor region comprised of a plurality of resistors each formed of the single-crystal silicon device forming layer;

a MOS transistor disposed on the single-crystal silicon device forming layer, the MOS transistor having a thin gate oxide film and a gate electrode disposed on the thin gate oxide film;

a plurality of electrodes disposed over the respective resistors and made of the same material as that of the gate electrode of the MOS transistor;

a plurality of impurity diffusion regions disposed in surface portions of the silicon substrate located under the respective resistors; and a plurality of contact holes formed at least through the buried insulating film, each of the contact holes being filled with a conductor that electrically connects a corresponding one of the resistors to the corresponding electrode and impurity diffusion region to fix a potential of the resistor.

4. A semiconductor device according to claim 3; wherein the electrodes are disposed on a thin insulating film made of the same material as that of the thin gate oxide film of the MOS transistor.

5. A semiconductor device according to claim 3; wherein each of the electrodes is fixed to a potential that is identical to a potential of the resistor over which the electrode is disposed.

6. A semiconductor device according to claim 3; wherein each of the impurity diffusion regions is fixed to a potential that is identical to a potential of the resistor under which the impurity diffusion region is disposed.

* * * * *